US010157806B2

(12) United States Patent
Bogen

(10) Patent No.: US 10,157,806 B2
(45) Date of Patent: Dec. 18, 2018

(54) POWER ELECTRONIC SUBMODULE COMPRISING A BIPARTITE HOUSING

(71) Applicant: Semikron Elektronik GmbH & Co., KG, Nürnberg (DE)

(72) Inventor: Ingo Bogen, Nürnberg (DE)

(73) Assignee: Semikron Elektronik GmbH & Co., KG, Nürnberg (DE)

( * ) Notice: Subject to any disclaimer, the term of this patent is extended or adjusted under 35 U.S.C. 154(b) by 0 days.

(21) Appl. No.: 15/249,075

(22) Filed: Aug. 26, 2016

(65) Prior Publication Data

US 2017/0062296 A1    Mar. 2, 2017

(30) Foreign Application Priority Data

Aug. 26, 2015  (DE) .......................... 10 2015 114 188

(51) Int. Cl.
*H01L 23/34*  (2006.01)
*H01L 23/053*  (2006.01)
(Continued)

(52) U.S. Cl.
CPC .......... *H01L 23/053* (2013.01); *H01L 23/043* (2013.01); *H01L 23/10* (2013.01);
(Continued)

(58) Field of Classification Search
CPC ..... H01L 23/053; H01L 24/24; H01L 25/072; H01L 23/12; H01L 23/10;
(Continued)

(56) References Cited

U.S. PATENT DOCUMENTS 7,589,418 B2 *  9/2009  Lederer ................... H01L 24/72
                                                    257/719
9,627,343 B2 *  4/2017  Kroneder .............. H01L 23/043
(Continued)

FOREIGN PATENT DOCUMENTS

DE     10 2013 104 949 B3    4/2014
DE     10 2013 104 950 B3    4/2014

OTHER PUBLICATIONS

German Patent Office Examination Report in German priority case; dated May 2, 2016.

*Primary Examiner* — Shouxiang Hu
(74) *Attorney, Agent, or Firm* — The Law Offices of Roger S. Thompson

(57) ABSTRACT

A submodule comprising: a substrate, a power semiconductor component, a connection device, a terminal device and an insulating body. The substrate has conductor tracks electrically insulated from one another, and the component is electrically conductively connected to a track. The connection device is a film composite with a first surface facing the component and the substrate and an opposed second surface. The insulating body has: a first partial body, connected to an edge of the substrate, a first cutout for a terminal, a second partial body, embodied as a pressure body and a second cutout, with a pressure element projecting therefrom. The second partial body is movable relative to the first partial body in the direction of the substrate to press with the pressure element onto a section of the second surface. The section is within the area of the component in projection along the direction of the normal thereto.

23 Claims, 4 Drawing Sheets

(51) Int. Cl.
*H01L 23/367* (2006.01)
*H01L 23/00* (2006.01)
*H01L 23/043* (2006.01)
*H01L 23/10* (2006.01)
*H01L 23/12* (2006.01)
*H01L 23/498* (2006.01)
*H01L 25/07* (2006.01)

(52) U.S. Cl.
CPC ............ *H01L 23/12* (2013.01); *H01L 23/367* (2013.01); *H01L 23/3675* (2013.01); *H01L 23/49838* (2013.01); *H01L 24/24* (2013.01); *H01L 24/72* (2013.01); *H01L 25/072* (2013.01); *H01L 24/06* (2013.01); *H01L 24/32* (2013.01); *H01L 24/73* (2013.01); *H01L 24/83* (2013.01); *H01L 2224/04026* (2013.01); *H01L 2224/06181* (2013.01); *H01L 2224/24137* (2013.01); *H01L 2224/24226* (2013.01); *H01L 2224/32225* (2013.01); *H01L 2224/73267* (2013.01); *H01L 2224/8384* (2013.01); *H01L 2924/13055* (2013.01); *H01L 2924/13091* (2013.01)

(58) Field of Classification Search
CPC ........... H01L 23/49838; H01L 23/3675; H01L 2224/24226; H01L 24/06; H01L 2924/13055; H01L 24/32; H01L 2224/73267; H01L 2224/32225; H01L 2924/13091; H01L 2224/24137; H01L 2224/06181; H01L 2224/04026; H01L 24/83; H01L 24/73; H01L 2224/8384; H01L 24/07
USPC .................................. 257/719, 712
See application file for complete search history.

(56) References Cited

U.S. PATENT DOCUMENTS

| 9,768,094 | B2* | 9/2017 | Walter | ............... H01L 23/3675 |
| 2015/0061112 | A1* | 3/2015 | Bogen | ............... H05K 7/20927 257/714 |
| 2015/0069599 | A1 | 3/2015 | Göbl | |
| 2015/0325494 | A1* | 11/2015 | Kroneder | ............ H01L 23/4006 361/715 |

\* cited by examiner

POWER ELECTRONIC SUBMODULE COMPRISING A BIPARTITE HOUSING

BACKGROUND OF THE INVENTION

1. Field of the Invention

The invention is directed to a power electronic submodule comprising a bipartite insulating material body which can form a housing. The submodule can form a basic cell of a power semiconductor module or of a power electronic system by virtue of the fact that by itself or in combination with further, preferably substantially identical, submodules it forms the basic power electronic building block of the power semiconductor module or of the power electronic system.

2. Description of the Related Art

The prior art, for example disclosed in German Patent No. DE 10 2013 104 949 B3, discloses a switching device comprising a substrate, a power semiconductor component, a connection device, load terminal devices and a pressure device. In this case, the substrate has electrically insulated conductor tracks, wherein the power semiconductor component is arranged on a conductor track. The connection device is embodied as a film composite comprising an electrically conductive film and an electrically insulating film and has first and second main surfaces. The switching device is thereby connected in a circuit-conforming manner internally. The pressure device has a pressure body having a first cutout, projecting from which a pressure element is arranged, wherein the pressure element presses onto a section of the second main surface of the film composite and in that case said section is arranged within the area of the power semiconductor component in projection along the direction of the normal to the power semiconductor component.

SUMMARY OF THE INVENTION

It is an object of the invention is to provide an improved power electronic submodule, wherein the submodule can be used in a simple manner and as a basic cell allows a simple construction of power semiconductor modules or power electronic systems.

The inventive power electronic submodule comprises: a substrate; a power semiconductor component arranged thereon; a connection device; a terminal device and an insulating material body. In this case, the substrate has conductor tracks electrically insulated from one another, and the power semiconductor component is arranged on, and electrically conductively connected to, a conductor track. The connection device is embodied as a film composite which comprises an electrically conductive film and an electrically insulating film, and thus forms a first main surface facing the power semiconductor component and the substrate and a second main surface opposite the first main surface. The submodule is connected in a circuit-conforming manner internally by the connection device. The insulating material body has a first partial body, which is connected to an edge of the substrate, and furthermore has a first cutout for a terminal element. The insulating material body likewise has a second partial body, which is embodied as a pressure body and has a second cutout, through which a pressure element projects. The first partial body is connected to the second partial body so that said second partial body is movable relative to the first partial body in the direction of the substrate in order to press with the pressure element onto a section of the second main surface of the film composite. The section is arranged within the area of the power semiconductor component in projection along the direction of the normal to the power semiconductor component.

It goes without saying that, unless excluded per se, the features mentioned in the singular, in particular the power semiconductor module and therewith the pressure body, and as is routine in the art as the load terminal element, can be present multiply in the submodule according to the invention.

It is preferred if the first partial body is connected to the edge of the substrate partly or completely, preferably cohesively, more preferably by an adhesive connection.

It is particularly advantageous if the first partial body and the second partial body are embodied integrally.

It is further advantageous if the first partial body and the second partial body are connected to one another by a resilient intermediate body, in particular by a resilient lug.

Preferably, the insulating material body consists of a high-temperature-resistant thermoplastic, in particular of polyphenylene sulphide, and the pressure element consists of a silicone rubber, in particular of crosslinked liquid silicone.

It may be preferred if a, preferably planar, metal body is arranged on that side of the second partial body which faces away from the substrate. In this case, the metal body can be connected to the second partial body in a force-locking manner, preferably by a latching connection, or cohesively, preferably by an adhesive connection.

It may be advantageous if the terminal device is embodied as a film section and thus as part of the connection device.

Advantageously, the terminal device can be embodied as a load terminal device and/or as an auxiliary terminal device. Load and auxiliary terminal devices can likewise be present in the submodule.

One of the terminal devices can be embodied as a contact spring and can be connected to the substrate or the connection device in a force-locking and electrically conductive manner.

One of the terminal devices can be embodied as a press-fit contact and can be connected to the substrate or the connection device cohesively and electrically conductively.

One of the terminal devices can be embodied as a metal shaped body and can be connected to the substrate or the connection device in a force-locking manner, preferably in a pressure-contacted manner, or cohesively and in each case electrically conductively, preferably by a sintering connection or by a soldering connection. In the case where a force-locking connection is present, the introduction of force on the metal shaped body can preferably be effected by the second partial body.

It goes without saying that the different configurations of the invention can be realized individually or in arbitrary combinations in order to achieve improvements. In particular, the features mentioned and explained here and hereinafter can be used not only in the combinations indicated, but also in other combinations, or by themselves, without departing from the scope of the present invention.

Other objects and features of the present invention will become apparent from the following detailed description of the presently preferred embodiments, considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1:
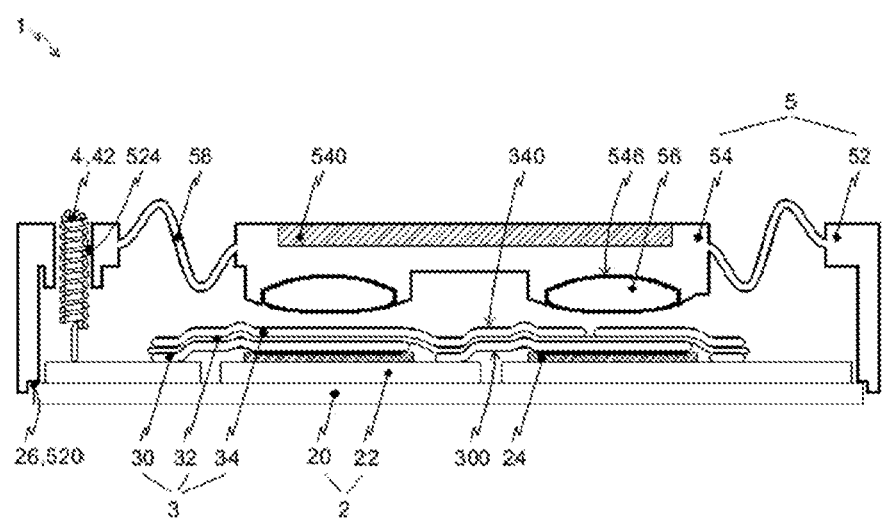
FIG. 1 shows a first configuration of a submodule according to the invention.

FIG. 1 shows a first configuration of a submodule 1 according to the invention. The illustration shows a substrate 2 embodied as is routine in the art, in principle, and comprising an insulating material body 20 and conductor tracks 22 arranged thereon and respectively electrically insulated from one another, conductor tracks 22 having different potentials, in particular load potentials, but also auxiliary, in particular switching and measurement, potentials, of submodule 1. Three conductor tracks 22 having load potentials such as are typical of a half-bridge topology are specifically illustrated here.

A respective power semiconductor component 24 is arranged on two conductor tracks 22, which power semiconductor component can be embodied as is routine in the art as a power diode or as a switch, for example as a MOS-FET, or as an IGBT. The respective power semiconductor components 24 are electrically conductively connected to an assigned one of conductor tracks 22 as is routine in the art, preferably by a sintering connection.

The internal connections of submodule 1 are formed by a connection device 3 made from a film composite having alternately electrically conductive films 30, 34 and electrically insulating films 32. Here film composite 3 has exactly two conductive films and one insulating film arranged therebetween. In this case, the surface 300 of film composite 3 which faces substrate 2 forms a first main surface thereof, while the opposite surface forms a second main surface 340. Particularly conductive films 30, 34 of connection device 3 are inherently structured and thus form conductor track sections electrically insulated from one another. Said conductor track sections connect in particular the respective power semiconductor components 24, more precisely the contact areas thereof on the side facing away from substrate 2, to conductor tracks 22 of substrate 2. In a preferred configuration, the conductor track sections are connected to the contact areas cohesively by a sintering connection. It goes without saying that connections between power semiconductor components 24 and between conductor tracks 22 of substrate 2 can also be formed in an identical way.

For external electrical linking, submodule 1 has load and auxiliary terminal elements 4, only one auxiliary terminal element 42 being illustrated here. Auxiliary terminal element 42 is embodied purely by way of example as a contact spring connected by a contact foot to a conductor track 22 of substrate 2 in a force-locking manner. In principle, parts of connection device 3 itself can also be embodied as load or auxiliary terminal elements. The load terminal elements (not illustrated) can moreover be embodied as is routine in the art.

The one auxiliary terminal element 42 illustrated, and advantageously also further auxiliary terminal elements (not illustrated) and the load terminal elements (likewise not illustrated) are arranged in cutouts 524 of an insulating material body 5 embodied as a housing or partial housing and are mounted there if appropriate also in a manner fixed in their position or movably but captively.

Insulating material body 5 itself is embodied integrally here with a first partial body 52, which is connected to edge 26 of substrate 2 by an adhesive connection, and with a second partial body 54, which is movable relative to first partial body 52 and thus also relative to substrate 2. For forming the movable arrangement, insulating material body 5 has two intermediate bodies 58, embodied here as lugs. Said lugs have an S-shaped course that allows the movement, in particular in the direction of the normal to substrate 2, of second partial body 54 relative to first partial body 52.

Second partial body 54 has, on its side facing substrate 2, cutouts 546 with pressure bodies 56 arranged therein and slightly projecting therefrom. Pressure bodies 56 are provided for pressing on sections, cf. description concerning FIG. 2, of second surface 340 of connection device 3 after pressure has been applied to second partial body 54. Said sections are respectively aligned with power semiconductor components 24 arranged underneath. Second partial body 54 is embodied particularly rigidly in order to be able to pass on pressure introduced on it homogeneously to pressure bodies 56. For this purpose and against the background of the thermal loads during operation of the switching device, second partial body 54 consists of a high-temperature-resistant thermoplastic, in particular of polyphenylene sulphide. Pressure bodies 56 must be able to exert a substantially constant pressure during operation and in this case in particular at different temperatures. For this purpose, pressure bodies 56 preferably consist of a silicone rubber, in particular of so-called crosslinked liquid silicone, also known as liquid silicone rubber (LSR), having a Shore A hardness of 20 to 70, preferably of 30 to 40. This is arranged by a two-component injection-molding method within second partial body 54.

Second partial body 54 additionally has a planar metal body 540, which in this case, without restricting the generality, is arranged in a further cutout at the side facing away from substrate 2.

In the non-loaded state, that is to say without pressure on second partial body 54, the latter and thus in particular also pressure bodies 56 are spaced apart from substrate 2 with arranged power semiconductor components 24 and with connection device 3.

Figure 2:
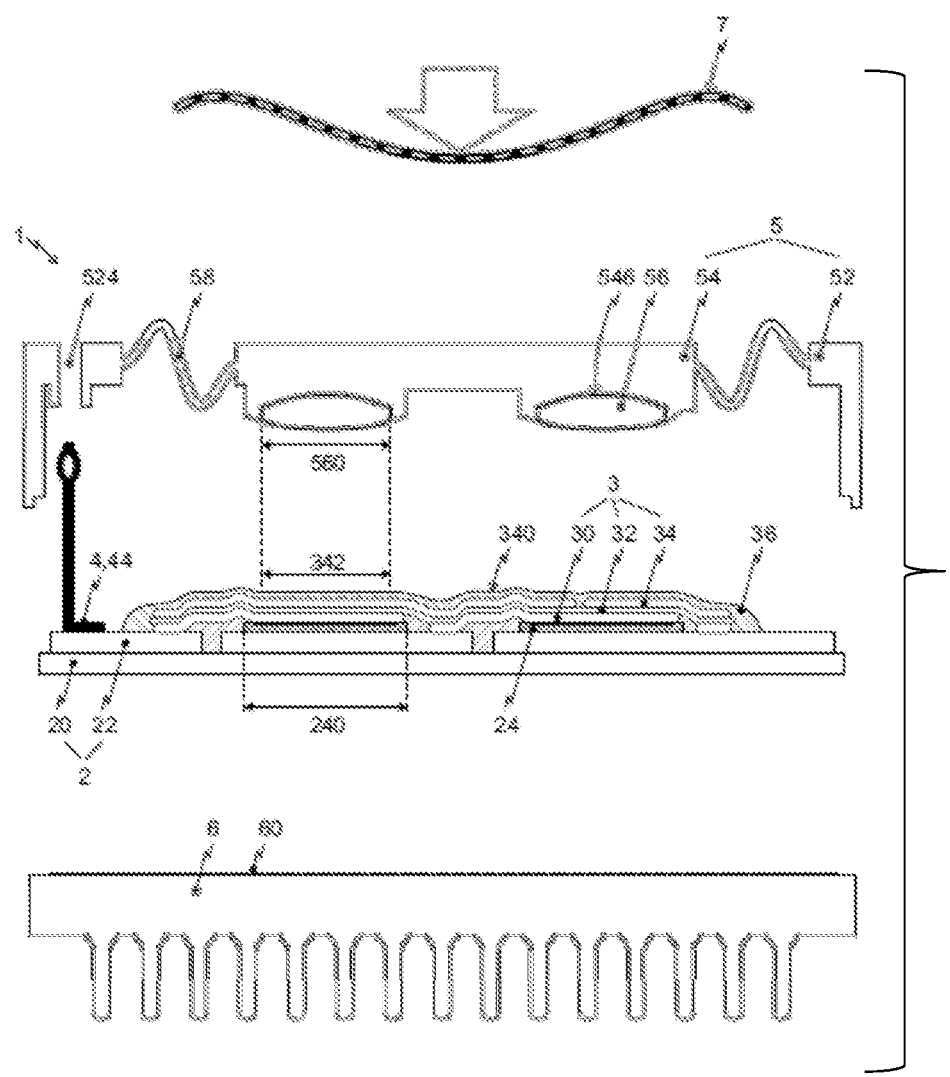
FIG. 2 shows an arrangement with a refinement of the inventive submodule.

FIG. 2 shows, in an exploded illustration, an arrangement with a second configuration of a submodule 1 according to the invention. The illustration here shows a submodule 1 which differs from that in accordance with FIG. 1 by virtue of a different configuration of the auxiliary terminal element, which here is embodied as a press-fit contact 44, and by virtue of the absence of the metal body of second partial body 54 and by virtue of an additional coating 36 of that surface of connection device 3 which faces away from substrate 2. Coating 36 can be embodied, on the one hand, as a potting or, on the other hand, as an additional film and serves in particular for protection against moisture. Coating 36 is ascribed here to the connection unit 3 itself, such that the surface of coating 36 thus forms surface 340 of connection device 3.

A cooling device 6 such as is routine in the art for dissipating heat from power semiconductor components 24 of the submodule 1 is additionally illustrated in this arrangement. For this purpose, submodule 1 is arranged on the surface of cooling device 6, wherein for this purpose a thermally conductive paste 60 is arranged between substrate 2 and cooling device 6 as is routine in the art. Cooling device 6 is embodied here as an air cooling device merely by way of example, without restricting the generality.

A pressure introducing device 7 is also illustrated purely schematically which introduces pressure on that surface of second partial body 54 which faces away from substrate 2. As a result of this introduction of pressure, second partial body 54 is pressed relative to first partial body 52, which is connected to edge 26 of substrate 2 and is thus non-movable relative thereto in the direction of the normal to substrate 2, in the direction of substrate 2. Consequently, pressure bodies 56 are pressed onto sections 342 of surface 340 of connection device 3 which are aligned with power semiconductor components 24. Preferably, as also illustrated, section 342 of connection device 3 on which pressure is introduced does not overlap the area 240 of the respectively assigned power semiconductor component 24 in projection.

Figure 3:
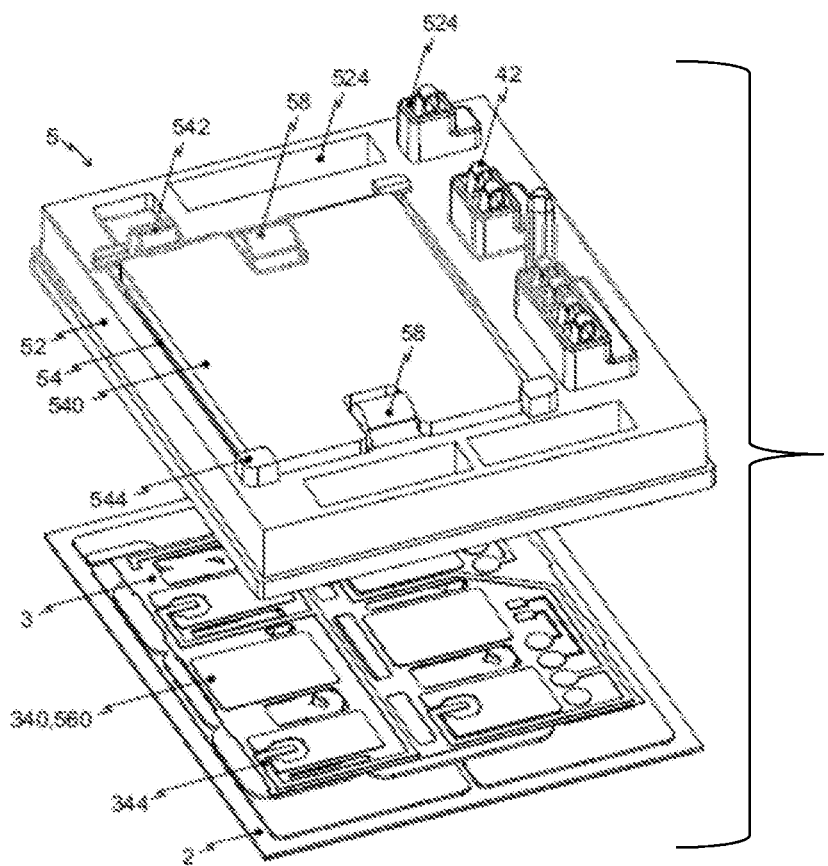
FIGS. 3 and 4 show three-dimensional views of a third refinement of the inventive submodule.
Figure 4:
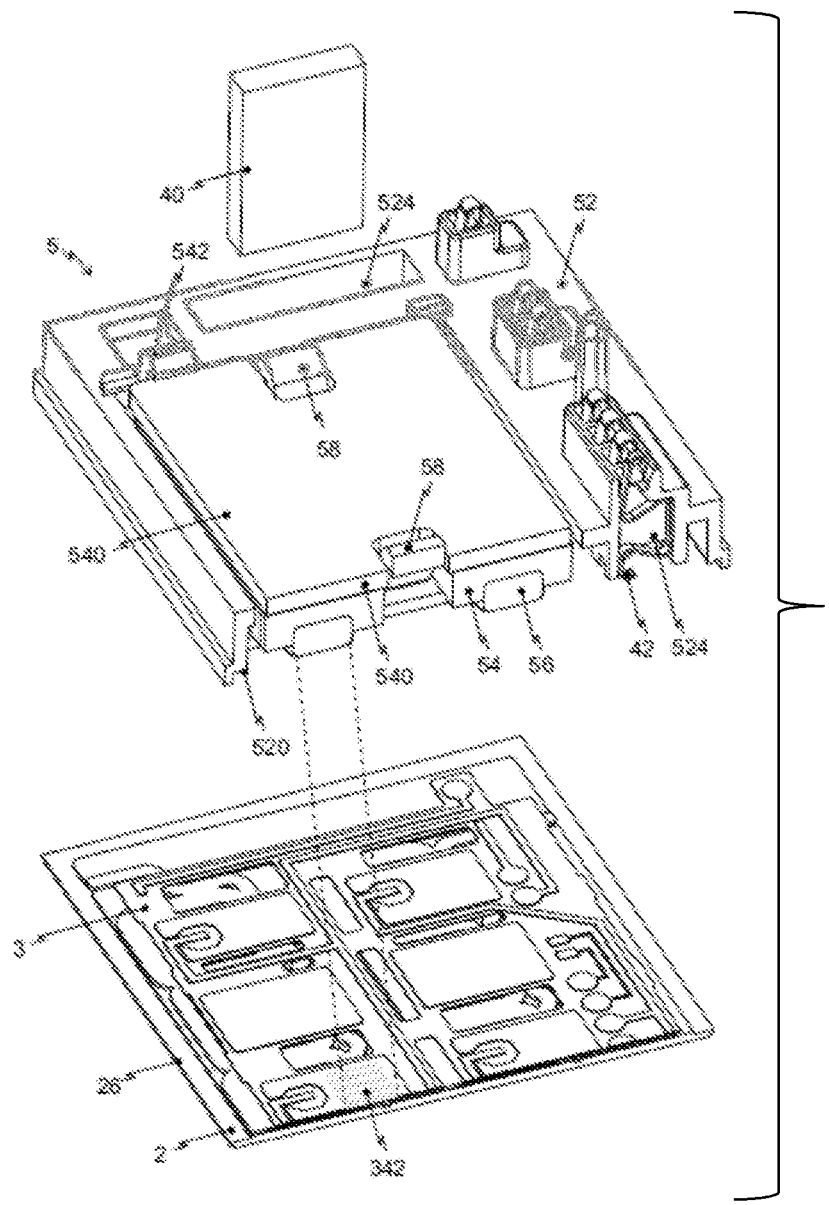

FIGS. 3 and 4 show three-dimensional views of a third refinement of a submodule 1 according to the invention, wherein FIG. 3 shows submodule 1 completely, but without a load terminal element, while FIG. 4 shows a sectional view through submodule 1.

The illustration shows firstly substrate 2 basically as is routine in the art, with arranged power semiconductor components 24 and a connection device 3, as described with regard to FIG. 1, for the internal circuit-conforming connection of submodule 1. In this case, connection device 3 covers power semiconductor components 24, such that the latter are not directly visible, but rather are arranged below the respective large rectangular sections of connection device 3. Arranged here are four IGBTs identifiable from the rectangles with gate leads 344, and two freewheeling diodes connected in antiparallel therewith, identifiable from the rectangles without a gate lead, which jointly form a half-bridge circuit.

Illustrated in a manner spaced apart therefrom is insulating material body 5, embodied integrally with a first partial body 52, a second partial body 54 and two intermediate bodies 56 connecting said partial bodies, said intermediate bodies here in turn being embodied as S-shaped lugs. First partial body 52 forms a frame around substrate 2, on edge 26 of which the lower edge 520 of first partial body 52 becomes located and is advantageously also connected there by an adhesive connection. In addition, first partial body 52 also has a cover region that partly covers substrate 2. A plurality of cutouts 524 are arranged in said cover region, the terminal elements being arranged in said cutouts. Load 40 and auxiliary terminal elements 42 are provided here as is routine in the art, wherein only the auxiliary terminal elements are illustrated in FIG. 3.

Load terminal element 4 illustrated in FIG. 4 is embodied purely by way of example as a metal shaped body connected by a contact foot to a conductor track 22 of substrate 2 cohesively, advantageously likewise by a soldering or sintering connection.

Second partial body 54, which is movable relative to first partial body 52 in the direction of substrate 2, that is to say in the direction of the normal thereto, has, on its side facing away from substrate 2, a metal body 540 bearing thereon, which metal body is fixed on the insulating body of second partial body 54 by a latching device 58, embodied—without restricting the generality—with a snap-action hook and two stop elements 544. Said metal body 540 serves for stability and uniform pressure distribution.

FIG. 4 additionally reveals pressure bodies 56 of second partial body 54, and also a section 342 of connection device 3 which is assigned to one of said pressure bodies 56 and on which said pressure body introduces pressure when pressure is applied to second partial body 54.

In the preceding Detailed Description, reference was made to the accompanying drawings, which form a part of this disclosure, and in which are shown illustrative specific embodiments of the invention. In this regard, directional terminology, such as "top", "bottom", "left", "right", "front", "back", etc., is used with reference to the orientation of the Figure(s) with which such terms are used. Because components of embodiments can be positioned in a number of different orientations, the directional terminology is used for purposes of ease of understanding and illustration only and is not to be considered limiting.

Additionally, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. Power electronic submodule comprising:
    a substrate having conductor tracks electrically insulated from one another and an edge;
    a power semiconductor component arranged on one of said conductor tracks and electrically conductively connected thereto;
    a connection device internally connecting the submodule in a circuit-conforming manner said connection device being embodied as a film composite having an electrically conductive film and an electrically insulating film, and thus having a first main surface which faces said power semiconductor component and said substrate, and a second main surface opposite said first main surface, said second main surface of said film composite having a section which is arranged within an area of said power semiconductor component in projection along the direction of the normal to the power semiconductor component;
    a terminal device;
    an insulating material body having:
        a first partial body, which is connected to said edge of said substrate, said first partial body also having a first cutout sized to receive said terminal device; and
        a second partial body, which is embodied as a pressure body and has a second cutout; and
    a pressure element disposed to project through said second cutout;
    wherein said first partial body and said second partial body are embodied integrally and connected so that said second partial body is movable relative to said first partial body in the direction of said substrate to press with said pressure element onto a section of said second main surface of said film composite, wherein said section is arranged within an area of said power semiconductor component in projection along the direction of the normal to said power semiconductor component.

2. The submodule of claim 1, wherein said first partial body is cohesively connected to said edge of said substrate.

3. The submodule of claim 2, wherein said first partial body is adhesively connected to said edge of said substrate.

4. The submodule of claim 1, wherein said first partial body and said second partial body are connected to one another by a resilient intermediate body.

5. The submodule of claim 4, wherein said resilient intermediate body is a resilient lug.

6. The submodule of claim 1, wherein said insulating material body is formed of a high-temperature-resistant plastic, and said pressure element consists of a silicone rubber.

7. The submodule of claim 6, wherein said high-temperature-resistant plastic is polyphenylene sulphide, and said silicone rubber is a crosslinked liquid silicone.

8. The submodule of claim 1, further comprising a metal body arranged on that side of said second partial body which faces away from said substrate.

9. The submodule of claim 8, wherein said metal body is substantially planar.

10. The submodule of claim 1, wherein said metal body is connected to said second partial body in a force-locking manner.

11. The submodule of claim 10, wherein force-locking manner is a latching connection.

12. The submodule of claim 8, wherein said metal body is cohesively connected to said second partial body.

13. The submodule of claim 12, wherein said cohesive connection is an adhesive connection.

14. The submodule of claim 1, wherein said terminal device is embodied as at least one of a load terminal device and an auxiliary terminal device.

15. The submodule of claim 1, wherein said terminal device is embodied as a film section and as part of said connection device.

16. The submodule of claim 1, wherein said terminal device is embodied as a contact spring and is connected to at least one of said substrate and said connection device in a force-locking and electrically conductive manner.

17. The submodule of claim 1, wherein said terminal device is embodied as a press-fit contact and is connected to at least one of said substrate and said connection device, cohesively and electrically conductively.

18. The submodule of claim 1, wherein said terminal device is embodied as a metal shaped body and is connected to at least one of said substrate and said connection device in a force-locking manner and electrically conductively.

19. The submodule of claim 18, wherein the introduction of force on said metal shaped body is effected by said second partial body.

20. The submodule of claim 18, wherein said force-locking manner is a pressure-contacted manner.

21. The submodule of claim 1, wherein said terminal device is embodied as a metal shaped body and is connected to at least one of said substrate and said connection device cohesively and electrically conductively.

22. The submodule of claim 21, wherein said connection between said terminal device and said at least one of said substrate and said connection device is a sintering connection.

23. The submodule of claim 21, wherein said connection between said terminal device and said at least one of said substrate and said connection device is a soldering connection.

* * * * *